(12) United States Patent
Hirashita et al.

(10) Patent No.: US 7,479,682 B2
(45) Date of Patent: Jan. 20, 2009

(54) STRUCTURE OF A FIELD EFFECT TRANSISTOR HAVING METALLIC SILICIDE AND MANUFACTURING METHOD THEREOF

(75) Inventors: Norio Hirashita, Tokyo (JP); Takashi Ichimori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 140 days.

(21) Appl. No.: 11/711,746

(22) Filed: Feb. 28, 2007

(65) Prior Publication Data

US 2007/0158757 A1  Jul. 12, 2007

Related U.S. Application Data

(63) Continuation of application No. 09/825,973, filed on Apr. 5, 2001, now Pat. No. 7,244,996.

(30) Foreign Application Priority Data

Apr. 6, 2000  (JP) ............... 2000-104733

(51) Int. Cl.
   *H01L 29/772* (2006.01)
(52) U.S. Cl. ............ 257/384; 257/377; 257/757; 257/768; 257/E21.44; 257/E29.161; 257/E29.119; 257/E21.627; 257/E21.439; 257/E21.438; 438/655; 438/656; 438/683; 438/233
(58) Field of Classification Search .......... 257/347, 257/351, 384, 377, 768, 757, E29.161, E29.119, 257/E21.627, E21.641, E21.199, E21.439, 257/E21.438, E21.44; 438/655, 656, 683, 438/154, 233
See application file for complete search history.

(56) References Cited

U.S. PATENT DOCUMENTS

| 4,968,644 | A   | 11/1990 | Gallagher et al. |
| 5,728,625 | A   | 3/1998  | Tung |
| 5,807,770 | A   | 9/1998  | Mineji |
| 5,915,197 | A   | 6/1999  | Yamanaka et al. |
| 6,323,130 | B1  | 11/2001 | Brodsky et al. |
| 6,344,675 | B1* | 2/2002  | Imai ................. 257/347 |

OTHER PUBLICATIONS

Deep sub-0.1 um MOSFET's with Very Thin SOL Layer for Ultra-Low Power Applicants, Information and Communication Engineers C-II vol. J81-CII No. 3, pp. 313-319, Aug, 1998.
Optimization of Series Resistance in Sub-0.2 um SOI MOSFET's, IEEE Electron Device letters, vol. 15, No. 9, Sep. 1994, p. 363-365.
Optimization of Series Resistance in Sub-0.2 um SOI MOSFET's, 1993 IEEE, pp. IEDM93-723-726-IEDM 93.

* cited by examiner

*Primary Examiner*—George Fourson
*Assistant Examiner*—Julio J Maldonado
(74) *Attorney, Agent, or Firm*—Volentine & Whitt, P.L.L.C.

(57) ABSTRACT

A field effect transistor having metallic silicide layers is formed in a semiconductor layer on an insulating layer of an SOI substrate. The metallic silicide layers are composed of refractory metal and silicon. The metallic silicide layers extend to bottom surfaces of source and drain regions. A ratio of the metal to the silicon in the metallic silicide layers is X to Y. A ratio of the metal to the silicon of metallic silicide having the lowest resistance among stoichiometric metallic silicides is X0 to Y0. X, Y, X0 and Y0 satisfy the following inequality: (X/Y)>(X0/Y0).

10 Claims, 5 Drawing Sheets

STRUCTURE OF A FIELD EFFECT TRANSISTOR HAVING METALLIC SILICIDE AND MANUFACTURING METHOD THEREOF

CROSS REFERENCE TO RELATED APPLICATION

This is a continuation application of application Ser. No. 09/825,973, filed on Apr. 5, 2001 now U.S. Pat. No. 7,244,996, which is hereby incorporated by reference in its entirety for all purposes.

The present application claims priority under 35 U.S.C. 119 to Japanese Application No. 2000-104733 filed on Apr. 6, 2000, which is hereby incorporated by reference in its entirety for all purposes.

BACKGROUND OF THE INVENTION (1). Field of the Invention

The present invention relates to a field effect transistor (FET) which is formed in a silicon layer located on an insulating film, or a silicon on insulator (SOI) substrate. The SOI substrate has an insulating film and a thin silicon layer formed over a conductive substrate is used as the conventional substrate to form the FET. The present invention also relates to a method of manufacturing such a field effect transistor.

(2). Description of the Related Art

Recently, a field effect transistor is formed on an SOI substrate (SOI-FET) in stead of a conventional bulk semiconductor substrate. The SOI-FET is formed in a thin silicon film (SOI layer) formed on an insulating film. As a junction capacitance is reduced, the SOI-FET can operate with a high-speed. Particularly, a fully depleted SOI-FET formed in the SOI layer is known as a low-power device which has a small parasitic capacitance and a subthreshold swing smaller than that of the conventional bulk semiconductor substrate. The fully depleted transistor has a depletion layer, which expands to the bottom surfaces of a source region and a drain region, when a voltage is supplied to a gate electrode thereof. As an expansion of depletion layers of the fully depleted SOI-FET is defined by a thickness of the SOI layer, a short channel effect can be restrained. Thus, for achieving the fully depleted operation of the SOI-FET, it is necessary to reduce the thickness of the SOI layer, as a device becomes microscopic.

The low-power device is shown in The article magazine of Institute of Electronics, Information and Communication Engineers C-II Vol. J81-C-II No. 3, pp. 313-319, "Deep Sub-0.1 μm MOSFET's with Very Thin SOI Layer for Ultra-Low Power Applications", published in March 1998 (hereinafter a first thesis). The shorter the gate length of the SOI-FET, the thinner the thickness of the SOI layer is. In the case where the gate length is 0.1 μm, the thickness of the SOI layer should be set 20 nm or below. Therefore, it is necessary to reduce the thickness of the SOI layer, if the SOI-FET becomes smaller. The thickness of the SOI layer becomes thinner, the deterioration of the drive current occurs since the enlargement of the parasitic resistance in the source and drain regions becomes remarkable. Nowadays, a silicide technology using titanium (Ti) or cobalt (Co) is adopted to restrain the deterioration of the drive current. A metallic silicide layer is comprised of refractory metal and silicon. Titanium disilicide ($TiSi_2$) and Cobalt disilicide ($CoSi_2$) are widely used for their low resistivity.

However, when the specific contact resistivity between a metallic silicide layer and a silicon layer exceeds $1 \times 10^{-7}$ $\Omega$–$cm^2$, and the thickness of the SOI layer located under the metallic silicide layer is less than 10 nm, the parasitic resistance would be increased so as to increase a resistance of a diffusion layer. As a result, the drive current of the SOI-FET might be reducing. This relationship is shown in IEEE ELECTRON DEVICE LETTERS, VOL. 15 No. 9, and pp. 363-365, "Optimization of Series Resistance in Sub-0.2 μm SOI MOSFET's", published in September 1998 (hereinafter a second thesis).

Currently, no metallic materials which have a specific contact resistivity less than $1 \times 10^{-7}$ $\Omega$–$cm^2$ have been known. Hence, it is required that the SOI-FET layer be comprised of a silicide layer and a non-silicide layer over 10 nm in a diffusion layer. However, when a gate length becomes smaller, the thickness of the SOI layer become too thin to form such silicide and silicon multi-layered structure.

SUMMARY OF THE INVENTION

It is an object of the present invention to provide a field effect transistor, having a satisfied drive current thereof for adapting microscopic devices.

In order to achieve the above object, in a field effect transistor having metallic silicide layers composed of refractory metal and silicon, the bottom surfaces of the metallic silicide layers respectively extend to the bottom surfaces of a semiconductor layer, wherein a ratio of the metal to the silicon in the metallic silicide layers is X to Y, a ratio of the metal to the silicon of metallic silicide having the lowest resistance among stoichiometric metallic silicides is X0 to Y0, and X, Y, X0 and Y0 satisfy the following inequality: (X/Y)>(X0/Y0).

According to the present invention, the field effect transistor is capable of restraining the reduction of the drive current thereof. The transistor of the present invention can be formed in a microscopic size.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood. In this description, one embodiment is shown in which the present invention is applied to a field effect transistor having metallic silicide layers.

First Embodiment

Figure 1:
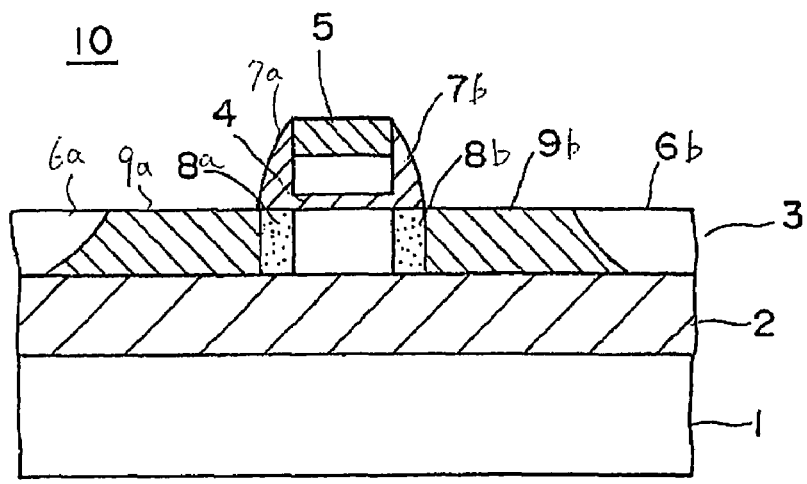
FIG. 1 is a cross-sectional view describing a field effect transistor according to a first preferred embodiment.

FIG. 1 is a cross-sectional view describing a field effect transistor according to a first preferred embodiment, showing in detail a fully depleted SOI-FET formed on an SOI substrate. The SOI-FET is formed in a thin silicon film (SOI layer) which is formed on an insulating film of the SOI substrate.

An SOI-FET 10 is formed on an SOI substrate which is comprised of a silicon substrate 1, an insulating layer 2 formed on the silicon substrate 1, and a thin silicon layer (SOI layer) 3 formed on the insulating layer 2. The SOI-FET 10 is formed in an active area surrounded by field oxide films 6a and 6b, and includes a gate electrode 5 of the SOI-FET is formed on a gate oxide film 4 which is formed on the SOI layer 3. A pair of highly doped silicon layers 8a and 8b is formed in a source region and a drain region under sidewalls 7a and 7b, respectively. A channel region is defined between the pair of highly doped silicon layers 8a and 8b.

The source and the drain regions excepting the highly-doped silicon impurity layers 8a and 8b are comprised of metallic silicide layers 9a and 9b. The metallic silicide layers 9a and 9b are composed of refractory metal and silicon. An amount of refractory metal contained in the metallic silicide layers 9a and 9b is more than that of silicon. In the first preferred embodiment, the metallic silicide layers 9a and 9b are comprised of a CoSiz layer in which a ratio of cobalt to silicon is one to z (1<z<2). In other words, a ratio of metal to silicon in the metallic silicide layer is X to Y, a ratio of metal to silicon of metallic silicide having the lowest resistance among stoichiometric metallic silicides is X0 to Y0, and X, Y, X0 and Y0 satisfy the following inequality: (X/Y)>(X0/Y0). The CoSiz layers 9a and 9b are formed by a conventional silicide process, for more detail, all of the source region and the drain region except under the sidewalls 7a and 7b are changed into the cobalt silicide layers 9a and 9b. That is, bottom surfaces of the cobalt silicide layers 9a and 9b extend to bottom surfaces of the SOI layer 3. An electrical connection between the CoSiz layers 9a and 9b and the SOI layer 3 is performed between the highly doped silicon layers 8a and 8b and the CoSiz layers 9a and 9b only.

According to the second thesis as described above, in the case where the contact specific resistance between refractory metal and silicon becomes less than $1\times10^{-7}$ $\Omega$-$cm^2$, the parasitic resistance of the transistor does not increase and the drive current of the transistor does not reduce. Inventors of the present invention found that the metallic silicide layers 9a and 9b are able to cause the contact specific resistance between refractory metal and silicon to be less than $1\times10^{-7}$ $\Omega$--$cm^2$. A result of verification will be shown as follows.

Figure 3A:
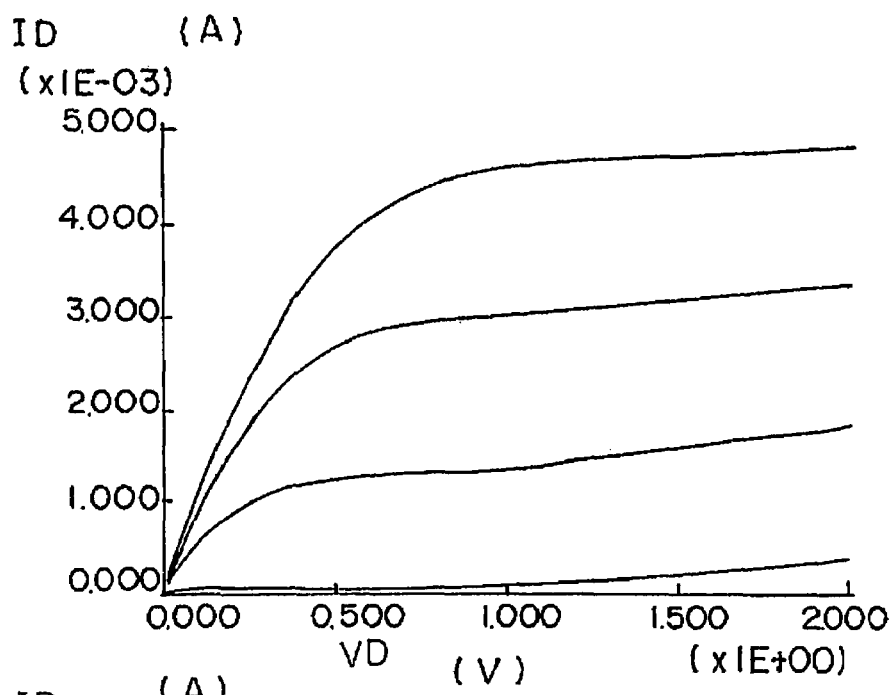
FIG. 3(a)-FIG. 3(b) are explanation diagrams describing relationship between the drain current and drain voltage characteristics of the fully depleted SOI-FET.
Figure 3B:
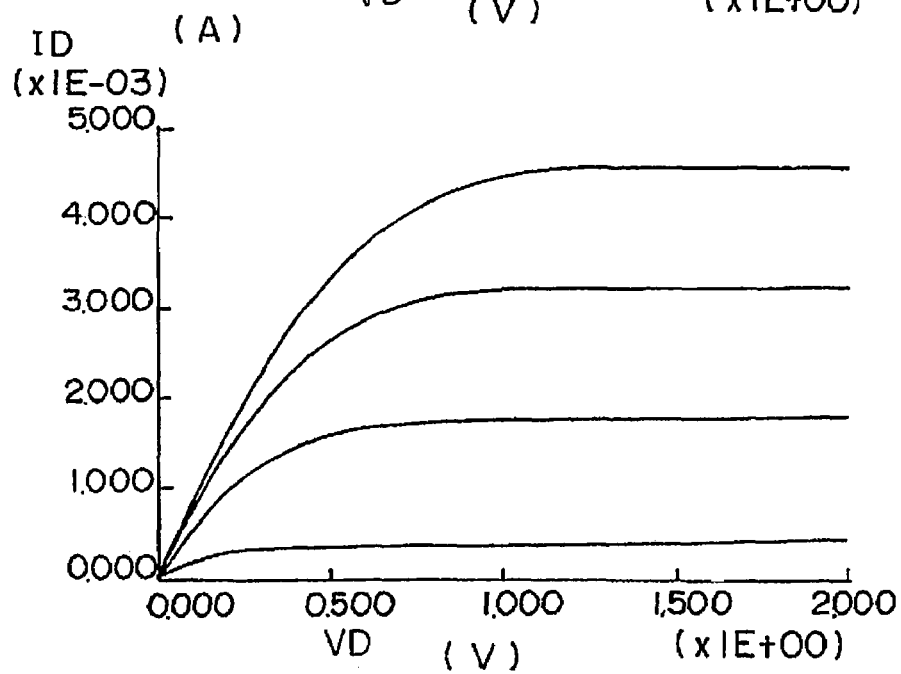

FIG. 3(a)-FIG. 3(b) are explanation diagrams describing relationship between the drain current and the drain voltage characteristic of the fully depleted SOI-FET. In the first preferred embodiment, the SOI-FET 10 is an N type MOS transistor. A characteristic between a drain current and a drain voltage of a conventional SOI-FET is shown in FIG. 3(a). The conventional SOI-FET is comprised of an SOI layer having a thickness of 50 nm and a pair of impurity layers having a thickness of more than 10 nm under $CoSi_2$ layers. A characteristic between the drain current and the drain voltage of the first preferred embodiment is shown in FIG. 3(b). The SOI-FET 10 is comprised of an SOI layer 3 having a thickness of 20 nm, sidewalls 7a and 7b having a width of 0.1 µm, a pair of highly doped silicon layers 8a and 8b, and the CoSiz layers 9a and 9b formed by a silicide process. The CoSiz layers 9a, 9b are composed that all of the source region and the drain region except under sidewalls 7a and 7b are changed into the cobalt silicide layers 9a and 9b. Both of the conventional FET and the SOI-FET of the first preferred of the invention are comprised of a gate length of 0.18 µm, a gate width of 10 µm and a gate oxide film having a thickness of 4.5 nm.

The drain current shown in FIG. 3(a) is similar to the current shown in FIG. 3(b). Wherefore, it is easily understood that the drive current of SOI-FET structure in the first preferred embodiment becomes stable. In other words, the drain current of both structures becomes stable when the drain voltage thereof exceeds a predetermined voltage. Additionally, it has been already identified that the drive current of a P type MOS SOI-FET is as stable as that of the N type MOS SOI-FET comprised of the N type MOS transistor. A range of the total series parasitic resistance of the SOI-FETs of the present embodiment is obtained as follows. The total series parasitic resistance of the N type MOS transistor is about 400 $\Omega$-µm. That of the P type MOS transistor is about 1K $\Omega$-µm.

Figure 6:
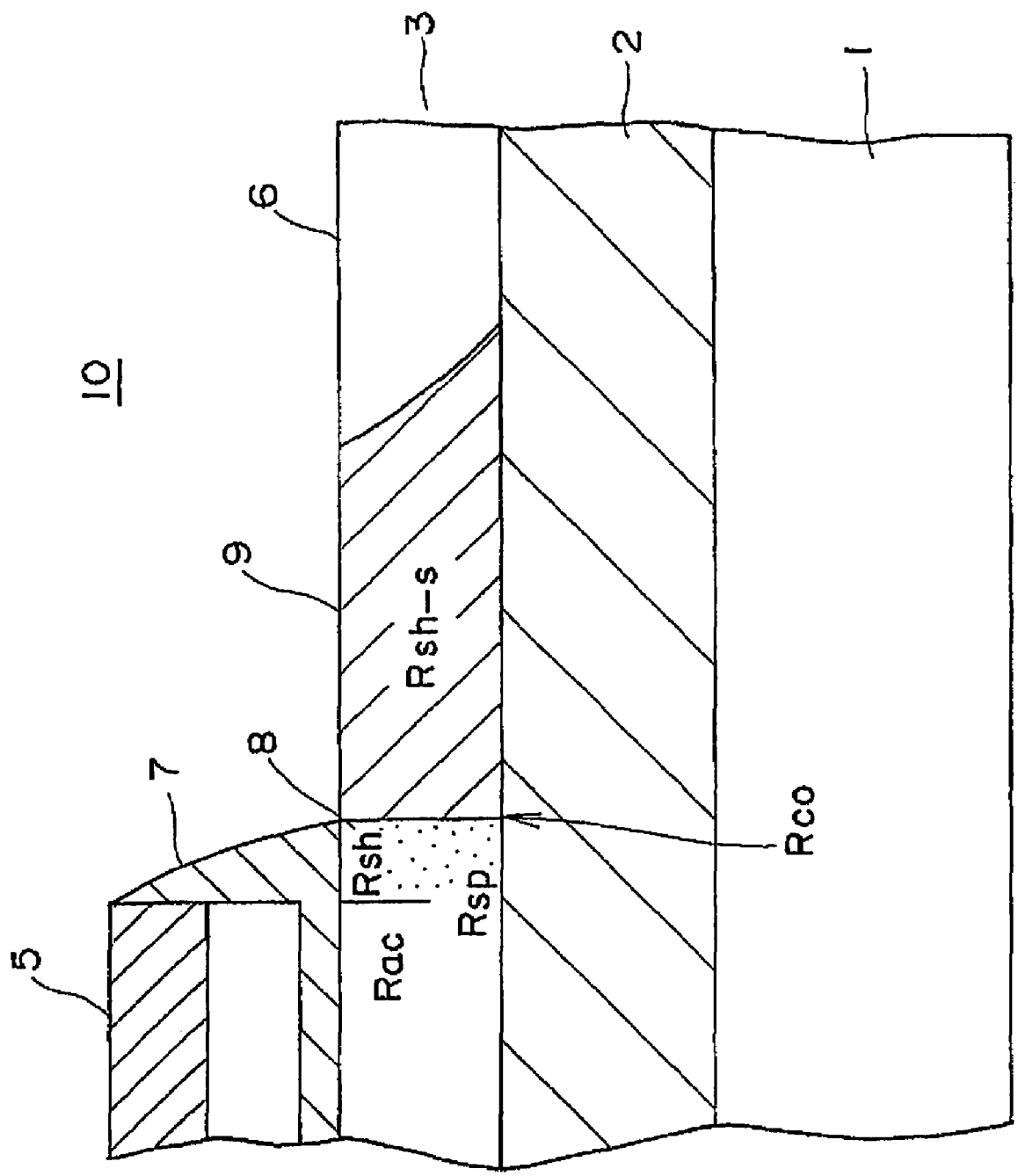
FIG. 6 is an enlarged cross-sectional view illustrating the first preferred embodiment.

An estimated total series parasitic resistance of the SOI-FET of the first preferred embodiment will next be described. FIG. 6 is an enlarged partial cross-sectional view of the SOI-FET described in FIG. 1. Incidentally, the same reference numbers identifies the same elements of structure as the SOI-FET shown in FIG. 1 and the description of certain common elements will therefore be omitted.

The total series parasitic resistance Rtot of the SOI-FET 10 is derived from a following formula.

$$Rtot=2\times(Rac+Rsp+Rsh+Rsh\text{-}s+Rco)$$

Wherein:

Rac represents an accumulation resistance of the highly doped silicon layer 8.

Rsp represents a spreading resistance of the highly doped silicon layer 8.

Rsh represents a diffusion layer resistance of the highly doped silicon layer 8 under a sidewall 7.

Rsh-s represents a sheet resistance of the CoSiz layer 9.

Rco represents a contact resistance between the highly doped silicon layer 8 and the CoSiz layer 9.

As the accumulation resistance Rac, the spreading resistance Rsp, and the sheet resistance Rsh-s are negligible small, they are out of consideration in the above formula.

If the impurity of $1\times10^{21}/cm^3$ is distributed in an N type drain region, the diffusion layer resistance of the N type MOS transistor becomes 80 $\Omega$/sq. Also, if the impurity of $1\times10^{20}/cm^3$ is distributed in a P type drain region, the diffusion layer resistance of the P tape MOS transistor is 500 $\Omega$/sq. The diffusion layer resistances Rsh of the N type MOS and the P type MOS transistors each having a channel width of 1 µm are 192 $\Omega$-µm and 450 $\Omega$-µm, respectively. The contact specific resistances between the $N^+$ and $P^+$ type drain regions and the CoSiz 9 is about $4\times10^{-8}$ $\Omega$-$cm^2$ and $9\times10^{-8}$ $\Omega$-$cm^2$, respectively.

In fact, it will be expected that the contact specific resistance would be further reduced, by considering the accumulation resistance Rac, the spreading resistance Rsp and the sheet resistance Rsh-s in the above formula. The contact specific resistance between the cobalt silicide (CoSix) and the silicon of the first preferred embodiment is far smaller than $1 \times 10^{-7}$ $\Omega$–cm$^2$ introduced in the above second thesis.

Figure 4:
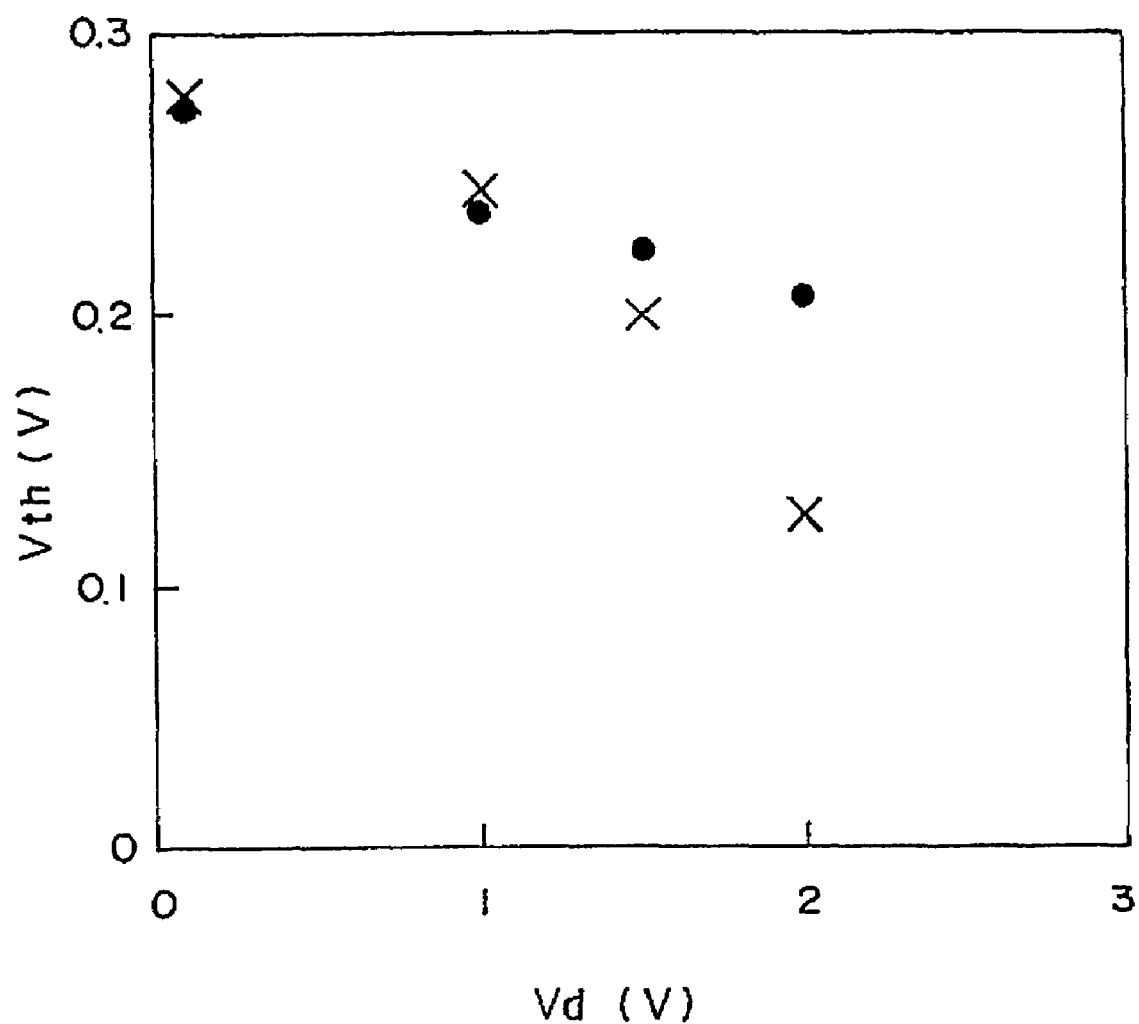
FIG. 4 is an explanation diagram showing the drain voltage dependence of a threshold voltage for the fully depleted SOI-FET.

FIG. 4 is an explanation diagram showing the drain voltage dependence of a threshold voltage for the fully depleted SOI-FET. In FIG. 4, the SOI-FET is the N type MOS transistor, as well as FIG. 3(a) and FIG. 3(b). The drain voltage of the conventional SOI-FET is shown as a mark of "x" and that of the first preferred embodiment is shown as a mark of "•". When a substrate floating effect, such as a parasitic bipolar effect occurs in the fully depleted SOI-FET, the drain voltage will rise up. FIG. 4 shows that a reduction of a threshold voltage of the conventional SOI-FET is remarkable, as a drain voltage rises up. However, the reduction of the threshold voltage of the SOI-FET of the first preferred embodiment is minimal. In other words, a leakage current of the SOI-FET can be cut down.

According to the first preferred embodiment of the present invention, a field effect transistor capable of restraining the reduction of the drive current of the SOI-FET is provided. Further, the SOI-FET of the first preferred embodiment enables formation of microscopic devices. Additionally, since the SOI-FET of the first preferred embodiment can precisely reduce the leakage current, the SOI-FET is useful as a low-power transistor.

Second Embodiment

Figure 2:
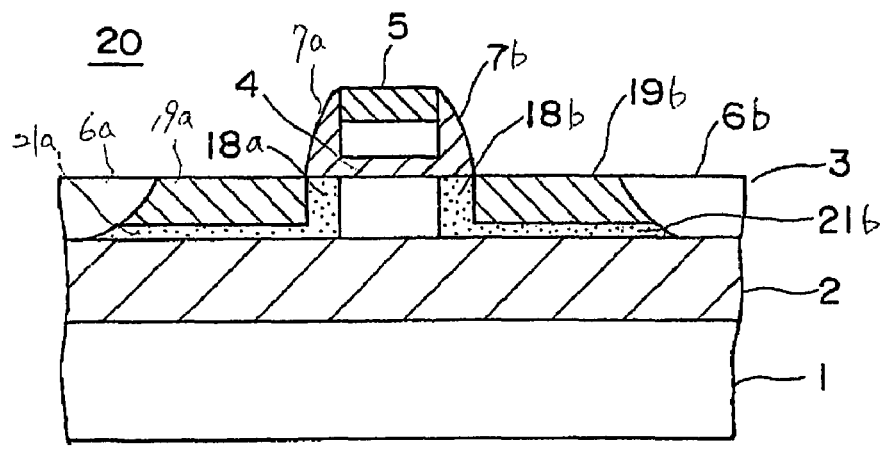
FIG. 2 is a cross-sectional view describing a field effect transistor according to a second preferred embodiment.

FIG. 2 is a cross-sectional view describing a field effect transistor (FET) according to a second preferred embodiment. Particularly, the FET is a fully depleted SOI-FET formed on an SOI substrate. Incidentally, the same reference numbers identifies the same elements of structure as those shown in FIG. 1.

An SOI-FET 20 is formed on an SOI substrate which comprises a silicon substrate 1, an insulating layer 2 formed on the silicon substrate 1, and a thin silicon layer (SOI layer) 3 formed on the insulating layer 2. The SOI-FET 20 is formed in an active area surrounded by field oxide film 6a and 6b. the SOI-FET 20 has a gate electrode 5 formed on a gate oxide film 4 located on the SOI layer 3. A pair of highly doped silicon layers 18a and 18b is formed in a source region and a drain region. A channel region is defined between to the pair of highly doped silicon layers 18a and 18b.

The source and the drain regions include the highly doped silicon layers 18a and 18b and metallic silicide layers 19a and 19b, respectively. The metallic silicide layers 19a and 19b are composed of refractory metal and silicon. An amount of refractory metal contained in the metallic silicide layers 19a and 19b is more than that of silicon. In the second embodiment as well as the first embodiment, the metallic silicide layers 19a and 19b are comprised of a CoSiz layer having a ratio of cobalt to silicon is one to z (1<z<2). The CoSiz layers 19a and 19b are formed by the conventional silicide process. In more detail, the source region and the drain region except under the sidewalls 7a and 7b are changed into the cobalt silicide layers 19a and 19b.

The CoSiz layers 19a and 19b respectively have a thickness which is equal to or more than 80% thickness of from top surfaces of the CoSiz layers 19a and 19b to bottom surfaces of the SOI layer 3. In other words, portions 21a and 21b of the highly doped silicon layers 18a and 18b respectively extend between bottom surfaces of the CoSiz layers 19a and 19b and a top surface of the insulating layer 2.

If a conventional CoSi$_2$ layer is used as the metallic silicide layer, the conventional CoSi$_2$ layer would be formed so as to have a thickness of the CoSi$_2$ layer less than 80% thickness of from top surfaces of the CoSi$_2$ to bottom surfaces of the SOI layer.

On the other hand, 1993 IEEE, pp. IEDM 93-723~726-IEDM 93, "OPTIMIZATION OF SERIES RESISTANCE IN SUB-0.2 m SOI MOSFETs" (hereinafter a third thesis), reports the following concerning a conventional CoSi$_2$ layer:

1) A void would be generated at an interface between a metallic silicide layer and a silicon layer.

2) A parasitic resistance, which increases traceable to increase a sheet resistance of the metallic silicide layer. The void and the parasitic resistance influence a characteristic of a semiconductor device.

According to the second preferred embodiment of the present invention, since the metallic silicide layers are comprised of the CoSiz layer in which a ratio of cobalt to silicon is one to z (1<z<2), a field effect transistor can be formed by the CoSiz layer having a thickness which occupies equal to or more than 80% thickness of from a top surface of the CoSiz layer to bottom surfaces of the SOI layer. In fact, the degradation of a device characteristic traceable to above 1) and 2) can be perfected.

According to the second preferred embodiment of the present invention, as a small amount of silicon remains under the metallic silicide layers, a field effect transistor having a low resistance and a stable metallic silicide layer can be provided.

Third Embodiment

Figure 5A:
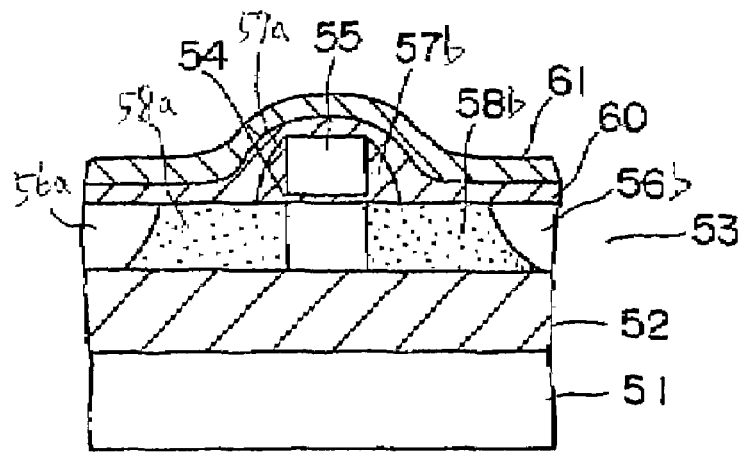
FIG. 5(a)-FIG. 5(c) are cross-sectional views describing a method of fabricating a field effect transistor according to a third preferred embodiment.

A method of manufacturing the field effect transistor described in the third preferred embodiment, will be shown hereinafter referring to FIG. 5(a)-FIG. 5(c). In FIG. 5(a), the SOI-FET is formed on an SOI substrate, which comprises a silicon substrate 51, an insulating film 52, and an SOI layer 53. Field oxide films 56a and 56b and heavily doped impurity layers 58a and 58b are formed in the SOI layer 53 by using a conventional process. A channel region is defined between the pair of highly doped silicon layers 58a and 58b. A gate electrode 55 is formed on a gate oxide film 54 and located on the channel region. Cobalt (Co) film 60 is formed on the gate electrode 55 and highly doped silicon layers 58a and 58b. The cobalt film 60 is a refractory metal film for forming a metallic silicide layer. A titanium (Ti) film 61 or a titanium nitride (TiN) film 61 are formed on the cobalt film 60 as an antioxidant film 61 when a following heat treatment.

Then, a first heat treatment is carried out. The first heat treatment is conducted at a temperature within a range of 400° C.~600° C. with a lamp. Thereby, the cobalt silicide layers are formed on top surfaces of the gate electrode 55 and the highly doped silicon layers 58a and 58b. The cobalt silicide layers 62a and 62b are comprised of CoSi which has a composition ratio of cobalt to silicon that is 1:1, and Co$_2$Si that includes more cobalt than silicon. In the third preferred embodiment, the cobalt silicide layers 62a and 62b formed by the first heat treatment, are comprised of CozSi (z>=1) as stated previously.

Figure 5B:
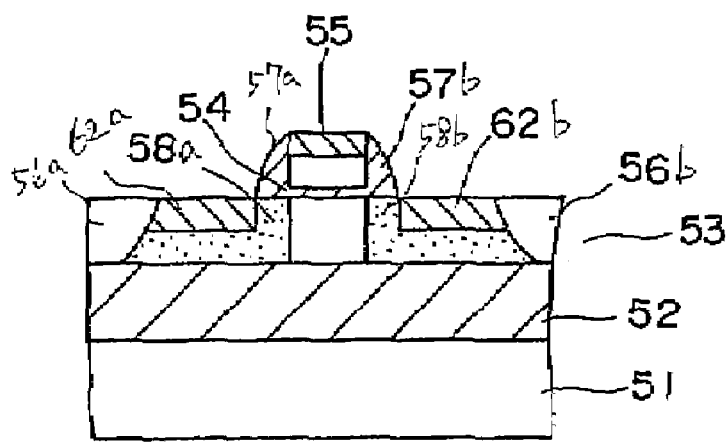
Figure 5C:
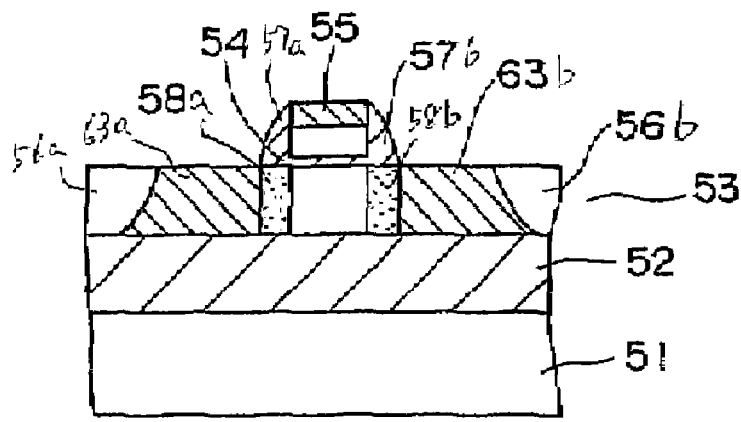

After the first heat treatment, the antioxidant film 61 and the cobalt film 60 remaining on the field oxide film 56 and the sidewalls 57a and 57b, are selectively removed by a conventional etching agent, such as aqueous sulfuric or aqueous ammonia, as shown in FIG. 5(b). Thereby, the cobalt layer remaining on the gate electrode 55 and the highly doped silicide layers 58a, 58b are removed.

Then, a dielectric interlayer is formed over the SOI substrate including the cobalt silicide layer 62a and 62b. Contact holes are formed in the dielectric interlayer, by a conventional process. In the third preferred embodiment, an illustration and a description of the conventional process are omitted.

Then, a second heat treatment is carried out. The second heat treatment is conducted at a temperature equal to or more than 700° C. with a lamp. Thereby, cobalt silicide layers 63a and 63b are formed on top surfaces of the gate electrode 55 and all of the highly doped silicon layers 58a and 58b expect under sidewalls 57a and 57b, as shown in FIG. 5(c). The resistance of the cobalt silicide layers 63a and 63b are smaller than that of the CozSi layers 62a and 62b. In the third preferred embodiment, the cobalt silicide layers 63a and 63b formed by the second heat treatment, are comprised of a CoSiz in which a composition ratio of cobalt to silicon is one to z (1<z<2).

The third preferred embodiment could be applied to manufacture the SOI-FET explained in the second preferred embodiment, as well as the first preferred embodiment.

According to the present invention, a field effect transistor capable of restraining the reduction of the current drive capacity of the transistor is provided. Also, the transistor as provided enables formation of microscopic devices including the SOI-FET described above. Since the transistor of the present invention can precisely reduce the leakage current, a low-power transistor can be provided. Additionally, as a small amount of silicon remains under the metallic silicide layers, a field effect transistor having a low resistance and a stable metallic silicide layer can be provided.

What is claimed is:

1. A field effect transistor including a gate electrode and a channel region defined by a source region and a drain region, comprising:
   an insulating layer;
   a semiconductor layer formed on the insulating layer, wherein the semiconductor layer includes the channel region therein;
   a pair of impurity layers respectively formed in the source region and the drain region, and which are in contact with the channel region; and
   a pair of metallic silicide layers respectively formed in the source region and the drain region, wherein the pair of metallic silicide layers are respectively in contact with the pair of impurity layers, wherein bottom surfaces of the pair of metallic silicide layers extend to bottom surfaces of the semiconductor layer,
   wherein the metallic silicide layers are composed of refractory metal and silicon,
   wherein a contact specific resistance between the metallic silicide layers and the impurity layers is less than $1 \times 10^{-7}$ $\Omega\text{-cm}^2$, and
   wherein the semiconductor layer has a thickness of 20 nm or below.

2. The field effect transistor according to claim 1, wherein said field effect transistor has a depletion layer which expands to bottom surfaces of the source region and the drain region when a voltage is supplied to the gate electrode thereof.

3. A field effect transistor including a gate electrode and a channel region defined by a source region and a drain region, comprising:
   an insulating layer;
   a semiconductor layer formed on the insulating layer, wherein the semiconductor layer includes the channel region defined by the source region and the drain region;
   a pair of impurity layers respectively formed in the source region and the drain region, and which are in contact with the channel region; and
   a pair of metallic silicide layers respectively formed in the source region and the drain region, wherein the pair of metallic silicide layers are respectively in contact with the pair of impurity layers, wherein the pair of metallic silicide layers have a thickness which is equal to or more than 80% thickness of from an upper surface of the metallic silicide layers to a bottom surface of the semiconductor layer,
   wherein the metallic silicide layers are composed of refractory metal and silicon,
   wherein a contact specific resistance between the metallic silicide layers and the impurity layers is less than $1 \times 10^{-7}$ $\Omega\text{-cm}^2$, and
   wherein the semiconductor layer has a thickness of 20 nm or below.

4. The field effect transistor according to claim 3, wherein said field effect transistor has a depletion layer which expands to bottom surfaces of the source region and the drain region when a voltage is supplied to the gate electrode thereof.

5. The field effect transistor according to claim 3, wherein the pair of impurity layers respectively extend between the pair of metallic silicide layers and the bottom surface of the semiconductor layer.

6. A field effect transistor formed in a semiconductor layer located on an insulating layer, the field effect transistor having a source region and a drain region formed in the semiconductor layer, comprising:
   the source region including a first impurity layer and a first metallic silicide layer, wherein the first impurity layer and the first metallic silicide layer are formed so as to reach the insulating layer through the semiconductor layer; and
   the drain region including a second impurity layer and a second metallic silicide layer, wherein the second impurity layer and the second metallic silicide layer are formed so as to reach the insulating layer through the semiconductor layer,
   wherein the first impurity layer is located so as to face to the second impurity layer,
   wherein a channel between the source region and the drain region is between the first impurity layer and the second impurity layer,
   wherein the first metallic silicide layer and the second metallic silicide layer are composed of refractory metal and silicon,
   wherein a first contact specific resistance between the first metallic silicide layer and the first impurity layer, and a second contact specific resistance between the second metallic silicide layer and the second impurity layer, are less than $1 \times 10^{-7}$ $\Omega\text{-cm}^2$, and
   wherein the semiconductor layer has a thickness of 20 nm or below.

7. The field effect transistor according to claim 6, wherein said field effect transistor has a depletion layer which expands to bottom surfaces of the source region and the drain region when a voltage is supplied to a gate electrode thereof.

8. A field effect transistor formed in a semiconductor layer located on an insulating layer, the field effect transistor having a source region and a drain region formed in the semiconductor layer, comprising:
   the source region including a first impurity layer and a first metallic silicide layer, wherein the first metallic silicide layer has a thickness which is equal to or more than 80% a thickness of from an upper surface of the first metallic silicide layer to a bottom surface of the semiconductor layer; and the drain region including a second impurity layer and a second metallic silicide layer, wherein the second metallic silicide layer has a thickness which is equal to or more than 80% a thickness of from an upper surface of the second metallic silicide layer to a bottom surface of the semiconductor layer, wherein the first impurity layer is located so as to face to the second impurity layer, wherein a channel between the source region and the drain region is between the first impurity layer and the second impurity layer, wherein the first metallic silicide layer and the second metallic silicide layer are composed of refractory metal and silicon, wherein a first contact specific resistance between the first metallic silicide layer and the first impurity layer, and a second contact specific resistance between the second metallic silicide layer and the second impurity layer, are less than $1 \times 10^{-7}$ $\Omega$-cm$^2$, and wherein the semiconductor layer has a thickness of 20 nm or below.

9. The field effect transistor according to claim 8, wherein said field effect transistor has a depletion layer which expands to bottom surfaces of the source region and the drain region when a voltage is supplied to a gate electrode thereof.

10. The field effect transistor according to claim 8, wherein the first impurity layer extends between the first metallic silicide layer and the bottom surface of the semiconductor layer, and wherein the second impurity layer extends between the second metallic silicide layer and the bottom surface of the semiconductor layer.

* * * * *